(12) United States Patent
Werner

(10) Patent No.: US 6,373,097 B1
(45) Date of Patent: Apr. 16, 2002

(54) FIELD-EFFECT-CONTROLLABLE, VERTICAL SEMICONDUCTOR COMPONENT, AND MONOLITHICALLY INTEGRATED HALF BRIDGE

(75) Inventor: Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 08/933,588

(22) Filed: Sep. 19, 1997

(30) Foreign Application Priority Data

Sep. 19, 1996 (DE) ......................................... 196 38 439

(51) Int. Cl.⁷ .......................... H01L 29/76; H01L 29/94; H01L 31/062; H01L 21/113
(52) U.S. Cl. ....................... 257/329; 257/330; 257/332; 257/333; 257/334; 257/341
(58) Field of Search ................................ 257/329, 341, 257/330, 332, 334, 333

(56) References Cited

U.S. PATENT DOCUMENTS

| | | | |
|---|---|---|---|
| 4,163,988 A | 8/1979 | Yeh et al. | 357/55 |
| 5,023,196 A | 6/1991 | Johnsen et al. | 437/40 |
| 5,321,289 A | * 6/1994 | Baba et al. | 257/331 |
| 5,426,321 A | 6/1995 | Hyodo | 257/329 |
| 5,473,176 A | 12/1995 | Kakumoto | 257/192 |
| 5,525,821 A | * 6/1996 | Harada et al. | 257/331 |

FOREIGN PATENT DOCUMENTS

| | | | |
|---|---|---|---|
| DE | 2 261 250 | 6/1974 | |
| DE | 196 06 105 A1 | 8/1996 | |
| JP | 6021468 | * 1/1994 | 257/330 |
| JP | 6053514 | * 2/1994 | 257/330 |

OTHER PUBLICATIONS

Japanese Patent Abstract No. 6–21468 A (Suzuki), dated Jan. 28 1994.
Japanese patent Abstract No. 6–53514 A (Matsumoto), dated Feb. 25, 1994.
Japanese Patnet Abstract No. 08308140 (Toshio), dated Nov. 22, 1996.
Japanese Patent Abstract No. 61142771 (Tsuneo), dated Jun. 30, 1986.
Japanese Patent Abstract No. 62159468 (Tetsuo), dated Jul. 15, 1987.
"A High–Performance Self–Aligned UMOSFET With a Vertical Trench Contact Structure", Matsumoto et al., 8093 IEEE transactions on Electron Devices, 41(1994)May, No. 5, New York, NY, US, pp. 814–818.
Siemens–Datenbuch, 1993/94 SIPMOS–Halbleiter, Leistungstransistoren und Dioden, pp. 29–64.

* cited by examiner

Primary Examiner—William Mintel
(74) Attorney, Agent, or Firm—Herbert L. Lerner; Laurence A. Greenberg; Werner H. Stemer

(57) ABSTRACT

A field-effect-controllable vertical semiconductor component, and a method for producing the same, include a semiconductor body having at least one drain region of a first conduction type, at least one source region of the first conduction type, at least one body region of a second conduction type between the drain regions and the source regions, and at least one gate electrode insulated from the entire semiconductor body by a gate oxide. A gate terminal and a drain terminal are located on a front side of the wafer, and a source terminal is located on a rear side of the wafer. A monolithically integrated half bridge with a low-side switch and a high-side switch includes the field-effect-controllable vertical semiconductor component and a conventional field-effect-controllable vertical semiconductor component.

9 Claims, 3 Drawing Sheets

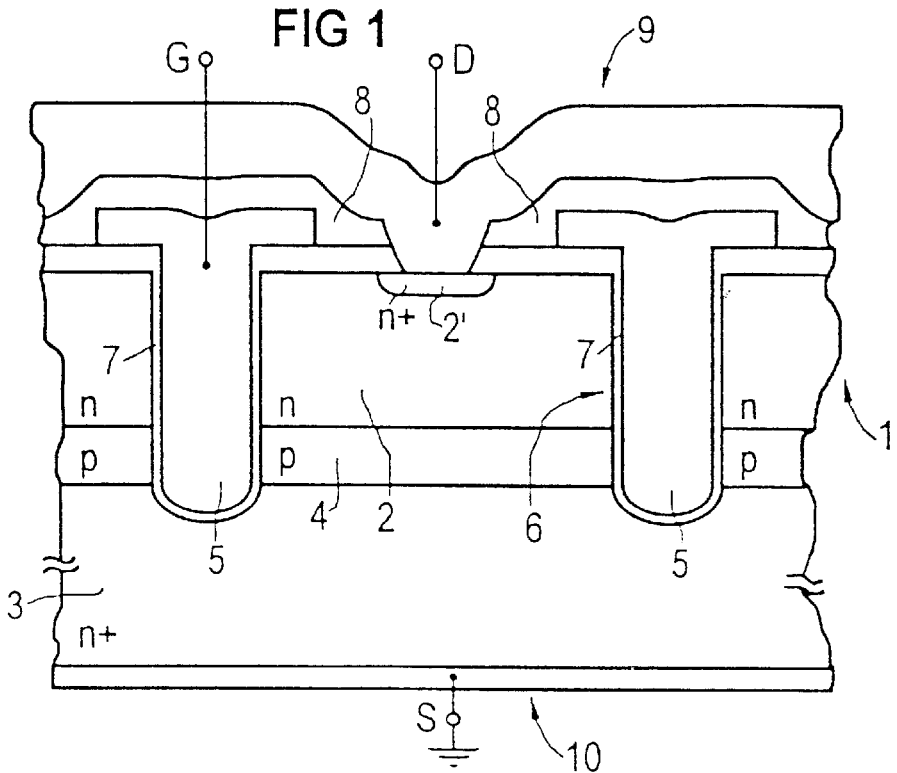
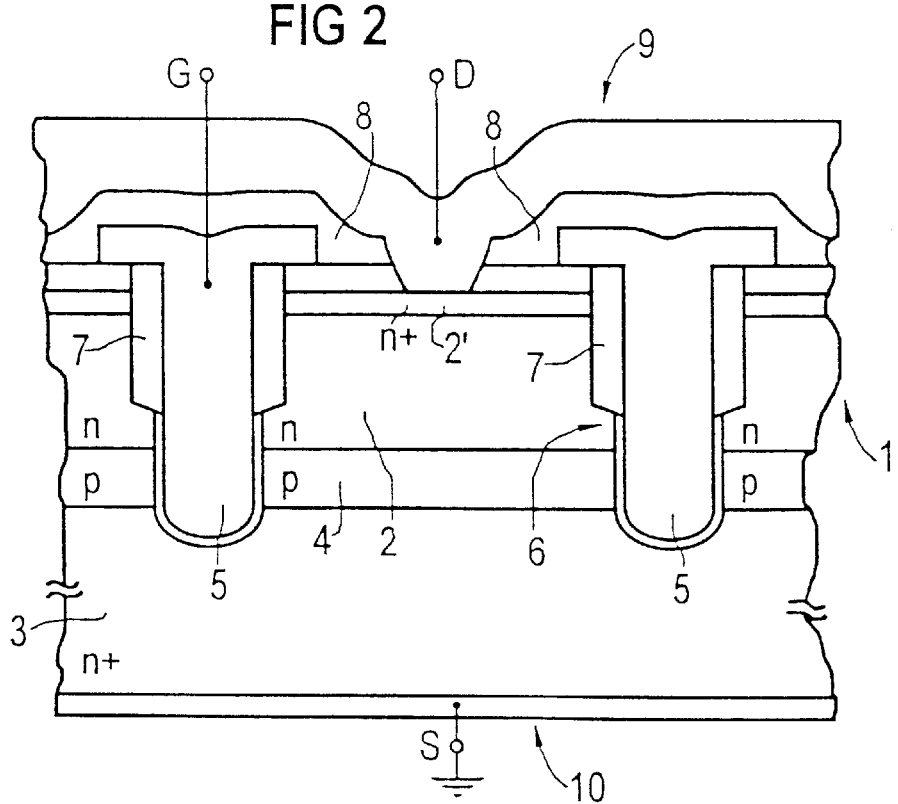

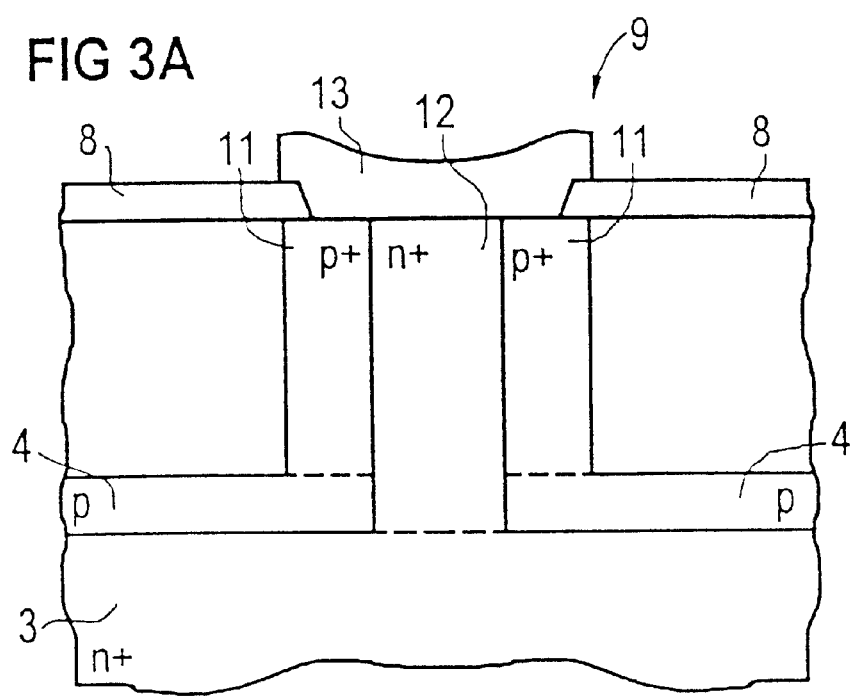
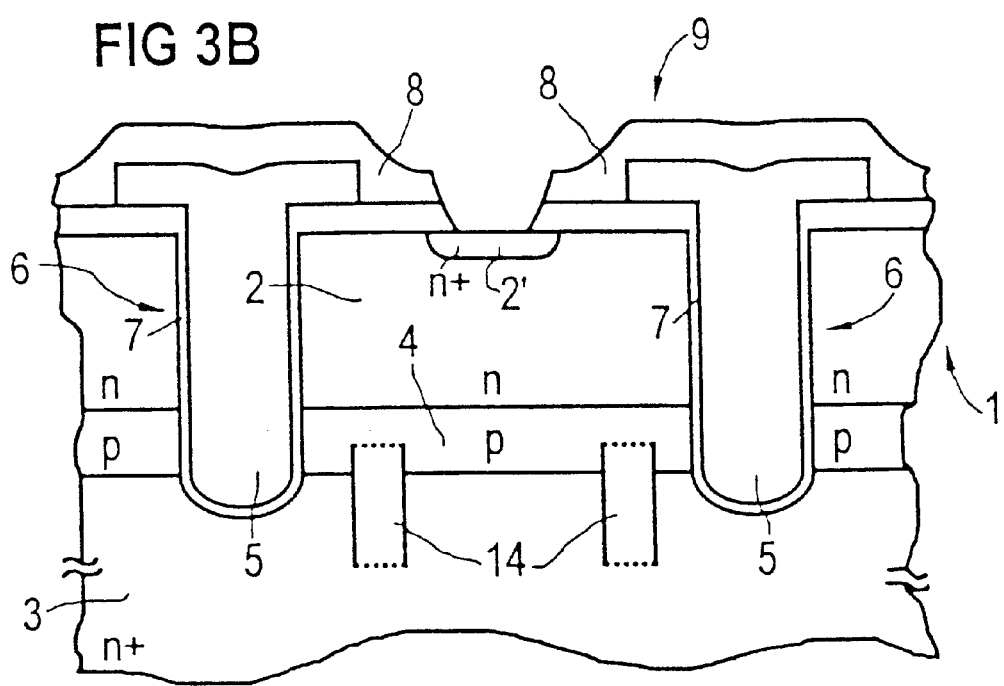

FIG 4
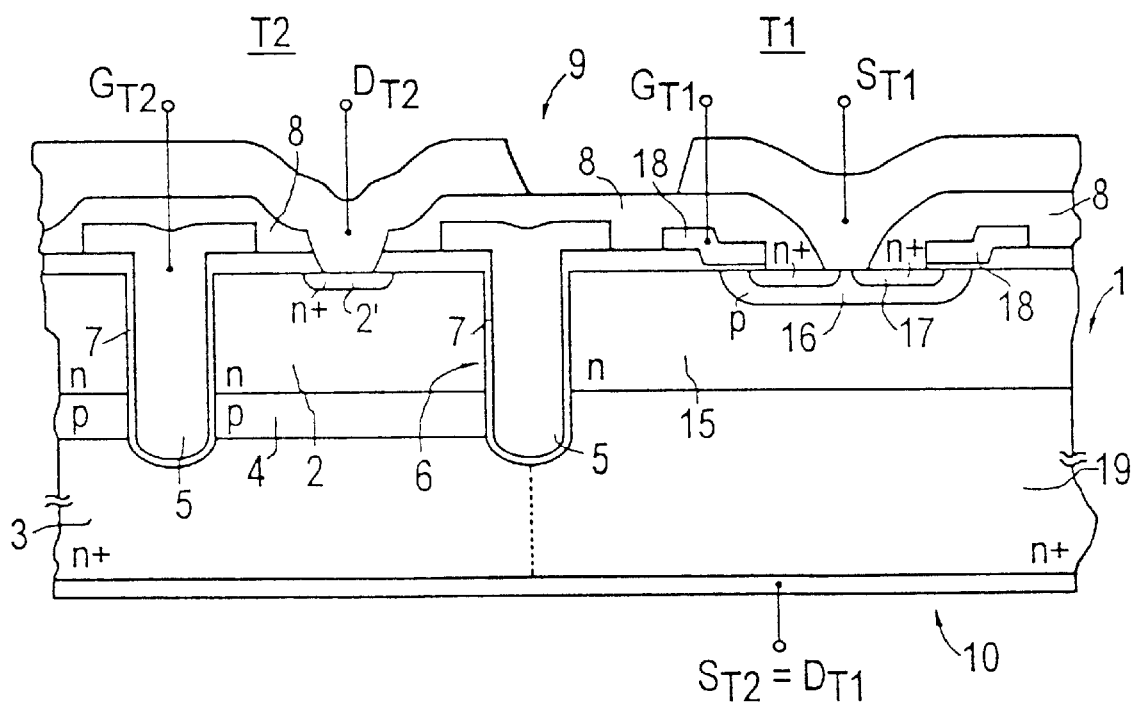
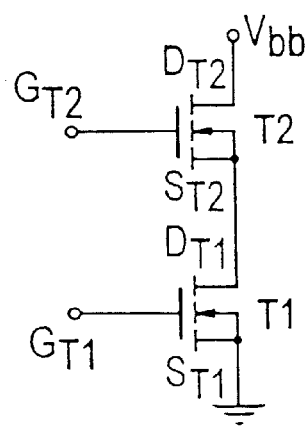

FIELD-EFFECT-CONTROLLABLE, VERTICAL SEMICONDUCTOR COMPONENT, AND MONOLITHICALLY INTEGRATED HALF BRIDGE

BACKGROUND OF THE INVENTION

Field of the Invention

The invention relates to a field-effect-controllable, vertical semiconductor component, including a semiconductor body having at least one drain region of a first conduction type, at least one source region of the first conduction type, at least one body region of the second conduction type separating the drain regions and source regions from one another, and at least one gate electrode insulated from the entire semiconductor body by a gate oxide. The invention also relates to a method for producing the semiconductor component and a monolithically integrated half bridge.

Field-effect-controllable semiconductor components of that kind are, for example, MOS field-effect transistors (MOSFETs). Such MOSFETs have been known for a long time and are described, for example, in the Siemens-Datenbuch [Data Manual] 1993/94 SIPMOS-Halbleiter, Leistungstransistoren und Dioden [SIPMOS Semiconductors, Power Transistors and Diodes], pp. 29 ff. FIG. 4 on page 30 of that data manual shows the basic layout of a power transistor of that kind. The transistor shown there is a vertical n-channel SIPMOS transistor. In such a transistor, the $n^+$ substrate serves as a carrier with the drain metallizing beneath it. Above the $n^+$ substrate, an n–epitaxial layer follows, which is variously thick and correspondingly doped depending on the depletion voltage. The gate over that, made of $n^+$ polysilicon, is embedded in insulating silicon dioxide and acts as an implantation mask for the p well and the $n^+$ source zone. The source metallizing covers the entire structure and connects the individual transistor cells of the chip in parallel. Further details of that vertically constructed power transistor can be found on pages 30 ff. of the aforementioned data manual.

A disadvantage of such a configuration is that the on-state resistance $R_{on}$ of the drain-to-source load path increases with increasing dielectric strength of the semiconductor component, since the thickness of the epitaxial layer necessarily increases. At 50 V, the on-state resistance $R_{on}$ per unit of surface area is approximately 0.20 $\Omega$ mm$^2$, and rises at a depletion voltage of 1000 V to a value of approximately 10 $\Omega$ mm$^2$, for instance.

In general a distinction is made between lateral and vertical MOSFETs. In contrast to lateral MOSFETs, vertical MOSFETs have a substantially vertical current flow direction. That causes the current to flow from the front side of the wafer to the rear side of the wafer. In vertical MOSFETs of that generic type, the source and gate terminals are located on the front side of the wafer, while the drain terminal is contacted through the rear side of the wafer.

Vertical MOSFETs have the advantage over lateral MOSFETs of being integratable on the semiconductor chip in a space-saving way, and therefore the components can be manufactured less expensively. Moreover, vertical transistors, in comparison with lateral structures, under the same process-related peripheral conditions or the same cell concepts, have a turn-on resistance $R_{on}$ that is about 50% less. The result thereof is that at the same turn-on resistance, the chip area in vertical transistors is only about half as large. The wafer costs for an intelligent vertical transistor are approximately 80% of those for a corresponding lateral transistor, such as an updrain transistor.

The processes which are currently used for vertical transistors make it possible to realize multichannel high-side switches. In those high-side switches, the drain terminal is on the rear side of the chip. It is currently possible to realize monolithically integrated multichannel low-side switches only with lateral or updrain structures.

SUMMARY OF THE INVENTION

It is accordingly an object of the invention to provide a field-effect-controllable, vertical semiconductor component, a method for producing the same and a monolithically integrated half bridge, which overcome the hereinafore-mentioned disadvantages of the heretofore-known devices and methods of this general type.

With the foregoing and other objects in view there is provided, in accordance with the invention, a field-effect-controllable vertical semiconductor component, comprising a semiconductor body having: front and rear wafer sides; at least one drain region of a first conduction type; at least one source region of the first conduction type; at least one body region of a second conduction type between the at least one drain region and the at least one source region; at least one gate electrode; and a gate oxide insulating the at least one gate electrode from the entire semiconductor body; a gate terminal and a drain terminal disposed on the front wafer side; and a source terminal disposed on the rear wafer side.

The invention has the advantage in particular of permitting the source contact on the rear side of the wafer to be secured directly to a device housing, without any insulating layer. The specific heat resistance is less as a result, which leads to improved heat dissipation through the rear side of the wafer.

In accordance with another feature of the invention, there are provided trenches, in which the gate electrodes and the gate oxide are located. Placing the gate electrodes in vertical trenches makes it possible on one hand to achieve further space savings in the vertical MOSFETs. On the other hand, MOSFETs with high breakdown voltages can advantageously be realized with a simultaneously low turn-on resistance $R_{on}$.

In accordance with a further feature of the invention, doped polysilicon is used as a material for the gate electrode, because in process terms it is simple to manipulate and it has good conductivity.

In accordance with an added feature of the invention, the gate oxide is thermally produced silicon dioxide, which is qualitatively quite valuable and is simple to manipulate in process terms.

In accordance with an additional feature of the invention, the gate oxide in the vicinity of the drain drift region is substantially thicker than in the vicinity of the body region and the source region. As a result, the depletion properties of the MOSFETs of the invention are additionally improved.

In accordance with yet another feature of the invention, there are provided ion-implanted contact regions embedded in the drain regions. These contact regions have a very high dopant concentration. This assures an ohmic contact between the contact regions and the drain terminals. The exact dopant dose can advantageously be determined through the use of ion implantation, and thus a defined dopant concentration of the contact region can be generated.

In accordance with yet a further feature of the invention, to avoid latch effects, the body regions are connected with low impedance to the source region.

In accordance with yet an added feature of the invention, there are provided first connection regions having the same conduction type as the at least one body region and a very high dopant concentration, the first connection regions connecting the at least one body region to a surface of the front wafer side, and a bonding contact wire short-circuiting the connection regions on the wafer surface to the source terminal.

In accordance with yet an additional feature of the invention, there are provided first and second connection regions of the same conduction type and a very high dopant concentration, the first and second connection regions each connecting a respective one of the at least one body region and the at least one source region to a surface of the front wafer side, and a connecting metallizing on the wafer surface short-circuiting the first and second connection regions.

In accordance with again another feature of the invention, there are provided further trenches filled with conductive material and short-circuiting the at least one body region and the at least one source region.

In accordance with again a further feature of the invention, there is provided a monolithically integrated half bridge including a low-side MOSFET according to the invention and a high-side MOSFET of the known type.

With the objects of the invention in view, there is also provided a production method for a field-effect-controllable vertical semiconductor component, which comprises the following steps: implanting one of boron and aluminum in a semiconductor body having a front wafer side, a rear wafer side and a source region, to produce a body region by an ensuing suitable temperature process; epitaxially growing an n-doped drain region on the body region defining a surface of the drain region; introducing contact regions into the drain regions near the surface by ion implantation; then applying and structuring a thick oxide to serve as a mask for trench etching; anisotropically etching trenches from the front wafer side to a depth of the source region defining walls of the trenches; growing thermal silicon dioxide as a gate oxide on the walls of the trenches; filling the trenches with n$^+$-doped polysilicon and then etching away excess polysilicon; depositing a field oxide on the front wafer side, and etching away excess field oxide at the contact regions of the drain regions; contacting the contact regions with aluminum; and metallizing the rear wafer side over a large surface area with aluminum.

In accordance with a concomitant mode of the invention, there is provided a production method for a field-effect-controllable vertical semiconductor component, which comprises depositing BPSG as the field oxide.

Other features which are considered as characteristic for the invention are set forth in the appended claims.

Although the invention is illustrated and described herein as embodied in a field-effect-controllable, vertical semiconductor component, a method for producing the same and a monolithically integrated half bridge, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view of a vertical MOSFET according to the invention with a source terminal on a rear side of a wafer;

FIG. 2 is a view similar to FIG. 1 of a vertical MOSFET of the invention with a different structure of a gate oxide and contact regions in a drain region;

FIGS. 3a and 3b are fragmentary, sectional views of various low-impedance body-to-source connections for avoiding latch effects; and FIG. 4 is a fragmentary, sectional view of one possibility for realizing a monolithically integrated half bridge by combining a low-side MOSFET of the invention as described with a highside MOSFET of the known type, and a schematic circuit diagram of the half bridge.

DESCRIPTION OF THE PREFERRED EMBODIMENTS

Referring now to the figures of the drawings in detail and first, particularly, to FIG. 1 thereof, there is seen a preferred embodiment of a vertical MOSFET according to the invention. A semiconductor body 1, for instance a silicon wafer, is n$^+$-doped. This n$^+$-doped region of the semiconductor body 1 at the same time forms a source region 3 of the MOSFET.

The source region 3 is contacted over a large surface area on a rear side 10 of the wafer through a typical metallizing. This metallizing forms a source terminal S. A thin p-doped layer and an n-doped layer are applied in succession over the source region 3 on a front side 9 of the wafer. The thin p-doped layer is applied by implantation and ensuing diffusion of dopant atoms out of the semiconductor body 1 (DMOS principle) and the n-doped layer is applied by epitaxial deposition. The p-doped layer will be referred to below as a body region 4 and the n-doped layer will be referred to as a drain region 2. The n-doped drain regions 2 have n$^+$-doped regions embedded on the surface of the wafer. These regions will be referred to below as contact regions 2'. The contact regions 2' have a very high dopant concentration, so that an ohmic contact between the semiconductor and the metallizing is assured. The contact regions 2' are typically introduced into the semiconductor body 1 by ion implantation. As a result, an exact dopant dose can be introduced into the semiconductor and the desired dopant concentration can thus be established in the contact regions 2'.

Trenches 6 are etched into the semiconductor body 1 on the front side 9 of the wafer. The trenches 6 extend from the surface of the wafer through the drain regions 2 and the body regions 4 as far as the interior of the source region 3. The cross section of the trenches 6 may be round, rectangular, or striplike, in other words it can be arbitrary. The trenches 6 contain gate electrodes 5. The gate electrodes 5 are insulated from the semiconductor body 1 by a thin gate oxide 7. Thermally grown silicon dioxide is preferably used as the gate oxide.

It is understood that the shape of the trenches 6 may be constructed variously, as needed. It is particularly advantageous for an apex line or turning point of the trenches 6 to be more U-shaped. One other possibility is to make the trenches 6 V-shaped. The contact regions 2' are contacted on the front side 9 of the wafer through a typical metallizing, such as aluminum. The drain metallizings are short-circuited in their entirety and connected to a drain terminal D. The controllable power of the MOSFETs can be increased through the use of the short-circuiting. Preferably, n$^+$-doped polysilicon is used for the gate electrodes 5, because of its simple manipulability in process terms and its good conductivity. Alternatively, a metal silicide may also be used as the material for the gate electrodes 5. The gate electrodes 5 are connected to gate terminals G. The drain metallizing is insulated from the gate electrodes 5 or the other surfaces of the semiconductor body by a field oxide 8. Boron phosphorous silicate glass (BPSG) is preferably used as the field oxide 8, because of its planarizing and gettering capability.

FIG. 2 shows the vertical MOSFETs of FIG. 1 according to the invention as additionally having a different structure of the gate oxide or contact regions in the drain region. Identical elements are identified by the same reference numerals as in FIG. 1.

The contact regions 2' are not introduced into the semiconductor surface in a structured manner but instead they directly border the trenches 6. On one hand this allows markedly lesser spacings of the trenches 6 from one another and therefore a greater channel width per unit of surface area. On the other hand, however, this requires a correspondingly thicker gate oxide 7 in the drain region 2. It can clearly be seen in FIG. 2 that the gate oxide 7 in the region of the source region 3 and the body region 4 is constructed to be substantially thinner than in the region of the drain region 2.

The production of the different oxide thicknesses in the trenches 6 can be carried out as follows. The semiconductor body 1 is structured with silicon dioxide, and the trenches 6 are etched anisotropically. Silicon dioxide is deposited into the trenches 6, and on the bottom of the trenches 6 the silicon dioxide is back-etched anisotropically. The trenches 6 are thereupon etched anisotropically down to a final depth. A thin silicon dioxide gate oxide 7 is applied by thermal oxidation.

The mode of operation of a configuration according to the invention as shown in FIGS. 1 and 2 will now be described in further detail.

If in the exemplary embodiment of FIG. 1 or FIG. 2, a positive voltage is applied to the gate electrodes 5, then an n channel forms in the p-doped body region 4, in the immediate vicinity of the gate electrodes 5. This channel is more or less n-conductive depending on the gate voltage that is applied. If the drain terminal is applied to positive potential, then a current flows from the source region 3 to the drain regions 2 through the n channel that is formed. The thickness of the body region 4 is a measure for the channel width of the MOSFETs. The thickness of the drain regions 2 is approximately equivalent to a drift path of the power MOSFETs and is thus a measure of the dielectric strength. The extent and the dopant concentration of the drain region 4, for example in the epitaxial application or diffusion, can be configured by the choice of suitable process parameters in such a way that the turn-on voltage and the channel length of the MOSFETs is precisely settable. What is important in this case is that the source region 3, which is formed essentially of the semiconductor body 1, be adequately highly doped, in order to assure a low-impedance connection with the rear side 10 of the wafer.

Along with the aforementioned cost advantages by economizing on chip area, the semiconductor components of the invention have the following additional advantages: the n-drift path 2, in contrast to conventional vertical high-side trench MOSFETs, is additionally cleared in the case of depletion next to the p body region 4 and also laterally from the gate electrodes 5. This permits the drift path in the drain region 2 to have higher doping, which reduces the turn-on resistance $R_{on}$.

It is also advantageous that between the gate electrodes 5 and the source region 3, or in other words in the region on the bottom of the trenches 6 that is critical with regard to gate oxide quality, only the gate voltage drops. Cross currents, which occur upon operation of inductive loads in BCD processes and can cause failure of the circuit at currents of approximately >4 amperes, do not occur in components of the invention, since in the case of cross current no minority charge carriers are injected into the substrate.

In order to avoid latch effects, the body region 4 must be connected with low impedance to the source region 3. FIGS. 3a and 3b shows examples of two possibilities for realizing this low-impedance connection.

In the structure of FIG. 3a, the body region 4 is connected to the surface of the front side 9 of the wafer through a $p^+$-doped first connection region 11. The source region 3 is also connected to the surface, through an $n^+$-doped second connection region 12. These $n^+$-doped and $p^+$-doped connection regions 11, 12 are short-circuited to one another through an overlapping connecting metallizing 13.

Another non-illustrated possibility is short-circuiting the first connection region 11 to the source terminal S on the rear side 10 of the wafer through a bonding contact wire.

A further possibility is shown in FIG. 3b. A further trench 14 which is provided between the body region 4 and the source region 3 is filled with conductive material, such as a silicide. This further trench 14 forms a direct short circuit between the body region 4 and the source region 3. Advantageously, no additional space is needed in this embodiment, in contrast to the previous embodiments.

FIG. 4 shows an example of the use of the semiconductor component according to the invention as shown in FIG. 1. Identical elements are identified by the same reference numerals as in FIG. 1.

It is possible to realize a monolithically integrated half bridge by combining a low-side MOSFET of the described type with a high-side MOSFET of the known type. Such bridge circuits are used in general in motors with high power consumption, especially in automobile electronics. FIG. 4 shows a fragmentary, sectional view of such a half bridge, including two self-depleting n-channel MOSFETs T1, T2, with an associated circuit diagram. In the following description, subscripts indicate a reference to the corresponding transistors T1 and T2.

The left-hand portion of FIG. 4 shows a vertical MOSFET T2 according to the invention as in FIG. 1. The right-hand portion of the fragmentary, sectional view of FIG. 4 shows a vertical MOSFET T1 of the known type. The $n^+$-doped source region 3 of the MOSFET T2 at the same time forms a drain zone 19 of the MOSFET T1. The drain zone 19 is adjoined by an n-doped region. This region will be referred to below as a drift region 15, and it forms the drift path of the drain region of the MOSFET T1. Embedded in the drift region 15 is a p-doped region. This region forms a channel zone 16 of the MOSFET T1. An $n^+$-doped region is in turn embedded in the channel zone 16. This $n^+$-doped region forms a source zone 17 of the MOSFET T1. The channel zone 16 and/or the source zone 17 is preferably introduced into the semiconductor by ion implantation. The source zone 17 is connected to a source terminal $S_{T1}$ through a metallizing. Gate electrodes 18, which are connected to a gate terminal $G_{T1}$, are also provided for the MOSFET T1. The gate electrodes 18 are insulated from the source metallizing through a field oxide 8. The gate electrodes 18 are located on the upper surface 9 of the wafer, in a region where the channel zone 16 borders on the surface.

The gate electrode 18 also extends partly into a region above the source zone 17 and the drift region 15. The gate electrodes 18 are each insulated by a thin gate oxide from the drift region 15, the channel zone 16 and the source region 17.

The two MOSFETs T1 and T2 as shown in FIG. 4 form a monolithically integrated half-bridge, having a circuit diagram which is also shown in FIG. 4.

Gate triggers of the two transistors T1, T2 may, but need not necessarily, be short-circuited. In the present example, the gate terminals $G_{T1}$, $G_{T2}$ are triggered separately. The source terminal $S_{T1}$ of the first transistor is connected to the ground potential. A drain terminal $D_{T1}$ of the first transistor corresponds to the source terminal $S_{T2}$ of the second transistor. The drain terminal $D_{T2}$ of the second transistor is connected to a supply voltage $V_{bb}$.

In a further application of the configuration according to the invention, CMOS transistors can be realized in the n-doped epitaxial region in a known non-illustrated manner by the p-well technique. Feedback effects on the components are made slight through the use of the ground connection on the rear side and the low-impedance connection with the front side of the wafer. Such additional provisions as guard rings, that are necessary in a corresponding process for vertical high-side transistors, are then no longer needed, which contributes to a substantial increase in the packing density and therefore to considerable cost advantages. Advantageously, components produced by this technology also have improved cooling through the rear side of the wafer. In an equivalent way, bipolar npn or pnp transistors can be made in this way as well.

A preferred production process for the vertical semiconductor components of the invention as shown in FIG. 1 will be described below.

The starting material for realizing the vertical MOSFETs according to the invention is an n$^+$-doped silicon substrate. A boron implantation is made into this silicon substrate to create the body region 4, and after that a suitable curing process is carried out. Next, the n-doped drain region 2 is grown epitaxially on the body region 4. It is possible to construct the body region 4 in terms of its extent or doping by the choice of suitable implantation parameters in such a way that it can be used as a channel zone of an MOS transistor. This permits the turn-on voltage or channel length to be adjusted in a targeted way through the use of the process parameters in the ion implantation. Next, the contact regions 2' are introduced in the drain region 2 near the surface by ion implantation. A thick oxide is applied and structured, which serves as a mask for the ensuing trench etching. Trenches 6 are then etched from the front side 9 of the wafer down into the source region 3 by using known process steps. A gate oxidation is performed, and then the trenches 6 are filled with n$^+$-doped polysilicon. The polysilicon is structured, and excess polysilicon is etched away. BPSG is deposited on the front side of the wafer and structured, and excess BPSG is etched away from the contact regions 2' of the drain regions 2. The drain regions 2 on the front side 9 of the wafer are contacted with aluminum. The rear side 10 of the wafer is metallized with aluminum over a large surface area. The short circuit between the body region 4 and the source region 3 is realized by the method that was already described above.

I claim:

1. A field-effect-controllable vertical semiconductor component, comprising:
    a semiconductor body having:
        front and rear wafer sides;
        at least one drain region of a first conduction type;
        at least one source region of the first conduction type;
        at least one body region of a second conduction type between said at least one drain region and said at least one source region;
    said semiconductor body having at least one trench formed therein extending from said front wafer side into said at least one source region;
    at least one gate electrode formed in said at least one trench, projecting above said at least one trench and partially overlapping a region of said at least one drain region adjoining said at least one trench;
    a gate oxide formed on said front wafer side and in said at least one trench insulating said at least one gate electrode from said entire semiconductor body; and
    contact regions embedded in said at least one drain region spaced apart from said at least one trench, said contact regions having the same conduction type as said at least one drain region and having a higher dopant concentration than said at least one drain region;
    a gate terminal and a drain terminal disposed on said front wafer side; and
    a source terminal disposed on said rear wafer side.

2. The field-effect-controllable vertical semiconductor component according to claim 1, wherein said at least one gate electrode is formed of polysilicon material.

3. The field-effect-controllable vertical semiconductor component according to claim 1, wherein said gate oxide is substantially thinner in the vicinity of said at least one body region and said at least one source region than in the vicinity of said at least one drain region.

4. The field-effect-controllable vertical semiconductor component according to claim 1, wherein said gate oxide is formed of thermal silicon dioxide.

5. The field-effect-controllable vertical semiconductor component according to claim 1, wherein said contact regions are ion-implanted.

6. The field-effect-controllable vertical semiconductor component according to claim 1, including connection regions having the same conduction type as said at least one body region and having a higher dopant concentration than said at least one body region, said first connection regions connecting said at least one body region to a surface of said front wafer side, and a bonding contact wire short-circuiting said connection regions on said wafer surface to said source terminal.

7. The field-effect-controllable vertical semiconductor component according to claim 1, including first and second connection regions of the same conduction type and having a higher doping concentration than said at least one body region and said at least one source region, respectively, said first and second connection regions each connecting a respective one of said at least one body region and said at least one source region to a surface of said front wafer side, and a connecting metallizing on said wafer surface short-circuiting said first and second connection regions.

8. The field-effect-controllable vertical semiconductor component according to claim 1, including trenches filled with conductive material and short-circuiting said at least one body region and said at least one source region.

9. A monolithically integrated half bridge with a low-side switch and a high-side switch, comprising:
    a field-effect-controllable vertical semiconductor component; and
    a field-effect-controllable vertical semiconductor component including a semiconductor body having:
        front and rear wafer sides;
        at least one drain region of a first conduction type;
        at least one source region of the first conduction type;
        at least one body region of a second conduction type between said at least one drain region and said at least one source region;

said semiconductor body having at least one trench formed therein extending from said front wafer side into said at least one source region;

at least one gate electrode formed in said at least one trench, projecting above said at least one trench and partially overlapping a region of said at least one drain region adjoining said at least one trench;

a gate oxide formed on said front wafer side and in said at least one trench insulating said at least one gate electrode from said entire semiconductor body; and contact regions embedded in said at least one drain region spaced aparat from said trenches, said contact regions having the same conduction type as said at least one drain region and having a higher dopant concentration than said at least one drain region;

a gate terminal and a drain terminal disposed on said front wafer side; and a source terminal disposed on said rear wafer side.

* * * * *

UNITED STATES PATENT AND TRADEMARK OFFICE
CERTIFICATE OF CORRECTION

PATENT NO.   : 6,373,097 B1
DATED        : April 16, 2002
INVENTOR(S)  : Wolfgang Werner It is certified that error appears in the above-identified patent and that said Letters Patent is hereby corrected as shown below:

Title page, Item [54] and Column 1, lines 1-4,
Should read as follows: -- FIELD-EFFECT-CONTROLLABLE, VERTICAL SEMICONDUCTOR COMPONENT, METHOD FOR PRODUCING THE SAME AND MONOLITHICALLY INTEGRATED HALF BRIDGE --

Signed and Sealed this

Twenty-fourth Day of September, 2002

Attest:

Attesting Officer

JAMES E. ROGAN
Director of the United States Patent and Trademark Office